(12) United States Patent
Gupta et al.

(10) Patent No.: US 6,874,135 B2
(45) Date of Patent: Mar. 29, 2005

(54) METHOD FOR DESIGN VALIDATION USING RETIMING

(75) Inventors: Aarti Gupta, Princeton, NJ (US); Pranav Ashar, Princeton, NJ (US); Sharad Malik, Princeton, NJ (US)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/404,599

(22) Filed: Sep. 24, 1999

(65) Prior Publication Data

US 2003/0182638 A1 Sep. 25, 2003

(51) Int. Cl.[7] ............................................. G06F 17/50
(52) U.S. Cl. ..................... 716/4; 716/5; 716/6; 716/2
(58) Field of Search .............................. 716/4, 5, 6, 2, 716/11, 10, 9, 8

(56) References Cited

U.S. PATENT DOCUMENTS

| | | | |
|---|---|---|---|
| 5,448,497 A | * | 9/1995 | Ashar et al. .................... 716/6 |
| 5,528,604 A | * | 6/1996 | El-Maleh et al. .............. 371/27 |
| 5,553,000 A | * | 9/1996 | Dey et al. ....................... 716/6 |

OTHER PUBLICATIONS

Gupta et al., Exploiting Retiming in a Guided Simulation Based Validation Methodology, Proceedings of the 10th Conference on Correct Hardware Design and Verification Methods, pp. 350–353, Sep. 1999.*

A. Gupta et al., Toward Formalizing a Validation Methodology Using Simulation Coverage, Proceedings of the 34th Design Automation Conference, pp. 740–745, Jun. 1997.*

C. Gianpiero et al., Optimizing Sequential Verification by Retiming Transformations,, Proceedings of the 37th Conference on Design Automation, pp. 601–606, Jul. 2000.*

R. Ho et al., Architecture Validation for Processors, Proceedings of 22nd International Symposium on Computer Architecture, pp. 404–413, May. 1995.*

C. Kim et al., Test Sequence Generation Methods for Protocol Conformance Testing, 18th Annual International Computer Software and Applications Conference, pp. 169–174 Nov. 1994.*

S. Huang et al., On verifying the correctness of retimed circuits, Proceedings., Sixth Great Lakes Symposium, pp. 277–280, Mar. 1996.*

N. Maheshwari et al., Minimum Area Retiming with Equivalent Initial States, IEEE/ACM International Conf. on Computer–Aided Design, pp. 216–219, Nov. 1997.*

K. Chen et al., Retargetable Static Timing Analysis for Embedded Software, 14th Annual Symposium on System Synthesis, pp. 39–44, Oct. 2001.*

(Continued)

*Primary Examiner*—A. M. Thompson
(74) *Attorney, Agent, or Firm*—Sughrue Mion, PLLC

(57) ABSTRACT

A method for derivation and abstraction of test models for validation of industrial designs using guided simulation is described. The method employs automatic abstractions for the test model which reduce its complexity while preserving the class of errors that can be detected by a transition tour. A method for design validation comprising generating a state-based test model of the design. The test model is abstracted by retiming and latch removal. Finally, a validation technique is applied on the abstracted test model. First, the number of internal (non-peripheral) latches in a design is minimized via retiming using a method of Maximal Peripheral Retiming (MPR). According to the MPR method, internal latches are retimed to the periphery of the circuit. Subsequently, all latches that can be retimed to the periphery are automatically abstracted in the test model. The validation technique may comprise of model checking, invariant checking or simulation using test sequences generated from the abstracted test model.

12 Claims, 13 Drawing Sheets

ORIGINAL MODEL

ABSTRACT MODEL

OTHER PUBLICATIONS

A. Gupta et al., Partition–based Decision Heuristics for Image Computation using SAT and BDD IEEE/ACM International Conference on Computer Aided Design, pp. 286–292, Nov. 2001.*

J–Y Jang et al., Iterative Abstraction–based CTL Model Checking, Proceedings., Design, Automation and Test in Europe Conference. pp. 502–507, Mar. 2000.*

N. Maheshwari et al., Efficient Retiming of Large Circuits, IEEE Transactions, on VLSI Systems, pp. 74–83, Mar. 1998.*

B. Lin, Restructuring of Synchronous Logic Circuits, 1993 European Conference on Design Automation, pp. 205–209, Feb. 1993.*

J. Frossl et al., An Efficient Algorithm for Real–Time Symbolic Model Checking, 1996 European Design and Test Conference, pp. 15–20, Mar. 1996.*

G. York et al., An Integrated Environment for HDL Verification, 1995 International Verilog HDL Conference, pp. 9–18, Mar. 1995.*

A. Casavant et al., Property–specific Witness graph generation for Guided Simulation, Proceedings of Design, Automation and Test in Europe, 2001, p. 799, Mar. 2001.*

Q. Li et al., Evolutionary Computer Aided Prototyping System, 34th International Conference on Technology of Object–Oriented Languages and Systems, pp. 363–372, Aug. 2000.*

O.C.–S. Choy et al., Test Generation with Dynamic Probe Points in High Observability Testing Environment, IEEE Transactions on Computers, pp. 88–96, Jan. 1996.*

K. Eckl et al., A Practical Approach to Multiple–Class Retiming, Proceedings, 36th ACM/IEEE Conference on Design Automation, pp. 237–242, Jul. 1999.*

S. Bommu et al., Retiming–based Factorization for Sequential Logic Optimization, ACM Transactions on Design Automation of Electronic Systems, pp. 373–398, Jul. 2000.*

A. Gupta et al., Property–Specific Testbench Generation for Guided Simulation, Proceedings, $15^{th}$ International Conference on VLSI Design, pp. 1–8, Mar. 2002.*

E. Clarke et al., Model Checking and Abstraction, ACM Transactions on Programming Languages and Systems, pp. 1512–1542, Sep. 1994.*

Shin–ichi Minato, "Generation of BDDs from Hardware Algorithm Descriptions," ICCAD, pp. 1–6, IEEE, 1996.

Farzan Fallah, et al., "Funtional Vector Generation for HDL Models Using Linear Programming and 3–Satisfiability," DAC, pp. 528–533, 1998.

H. J. Touati, et al., "Implicit State Enumeration of Finite State Machines Using BDDs," In Proceedings of the IEEE International Conf. on Computer–Aided Design, pp. 130–133, IEEE Computer Society Press, CA., 1990.

Ganesh Lakshminarayana, et al. "Incorporating Speculative Execution into Scheduling of Control–Flow Intensive Behavioral Descriptions," ACM, San Francisco, CA., pp. 108–113, 1998.

Reinaldo A. Bergamaschi, et al., "Observable Time Windows: Verifying High–Level Synthesis Results," IEEE Design and Test of Computers, IEEE, pp. 40–50, 1997.

J. Yuan, et al., "On Combining Formal and Informal Verification," In Proceedings of the Workshop on Computer–Aided Verification, vol. 1254 of Lecture Notes in Computer Science, pp. 376–387, NY, Jun. 1997.

Raul Camposano, "Path–Based Scheduling for Synthesis," IEEE Transactions on Computer–Aided Design, vol. 10, No. 1, pp. 85–93, Jan. 1991.

Roni Potasman, et al., "Percolation Based Synthesis," $27^{th}$ ACM/IEEE Design Automation Conf., pp. 444–449, 1990.

Subhrajit Bhattacharya, "Performance Analysis and Optimization of Schedules for Conditional and Loop–Intensive Specifications," $31^{st}$ DAC, pp. 491–496, 1994.

S. Owre, et al., "PVS: A Prototype Verification System," $11^{th}$ Int'l. Conf. on Automated Deduction, NY, pp. 748–752; Jun. 1992.

S. Malik, et al., "Retiming and Resynthesis: Optimizing Sequential Networks with Combinational Techniques," IEEE Transactions on Computer Aided Design of Integrated Circuits and Systems, 10(1):74–84, Jan. 1991.

Charles E. Leiserson, et al., "Retiming Synchronous Circuity," Algorithmica, 6(1):5–36, 1991.

E. M. Sentovich, et al., "Sequential Circuit Design Using Synthesis and Optimization," In Proceedings of the IEEE Int'l. Conf. on Computer Design, 1992.

A. Balakrishnan, et al., "Software transformations for Sequential Test Generation," In Fourth Asian Test Symposium, pp. 266–272, 1995.

J. R. Burch, et al., "Symbolic Model Checking for Sequential Circuit Verification," IEEE Transactions on Computer–Aided Design, 13(4):401–424, Apr. 1994.

Wayne Wolf, et al., "The Princeton University Behavioral Synthesis System," $29^{th}$ ACM/IEEE Design Automation Conf., pp. 182–187, 1992.

Chih–Tung Chen, et al., "A hybrid Numeric/Symbolic Program for Checking Functional and Timing Compatibility of Synthesized Designs," Technical Report Ceng, Univ. of Southern California, pp. 112–117, 1994.

D. Lewin, et al., "A Methodology for Processor Implementation Verification," In Proceedings of the Int. Conf. on Format Methods in CAD, pp. 126–142, Nov. 1996.

Robert E. Shostak, "An Algorithm for Reasoning About Equality," Communications of the ACM, vol. 21, No. 7, pp. 583–585, Jul. 1978.

R. C. Ho, et al. "Architecture Validation for Processors," In Proceedings of the $22^{nd}$ Annual Intl. Symposium on Computer Architecture, Jun. 1995.

K. Cheng, et al., "Automatic Functional Test Generation Using the Extended Finite State Machine Model," In Proceedings of the $30^{th}$ ACM/IEEE Design Automation Conf., pp. 86–91, Jun. 1993.

Yatin V. Hoskote, et al., "Automatic Extraction of the Control Flow Machine and Application to Evaluating Coverage of Verification Vectors," Technical Report Ceng, Univ. of Texas at Austin, pp. 532–537, 1995.

H. Iwashita, et al., "Automatic Test Program Generation for Pipelined Processors," In Proceedings of the IEEE Intl. Conf. on Computer Design, pp. 580–583, Oct. 1994.

A. K. Chandra, et al., "Avpgen—A Test Case Generator for Architecture Verification," IEEE Transactions on VLSI Systems, 6(6), Jun. 1995.

R. Gupta, et al., "Ballast: A Methodology for Partial Scan Design," In Proceedings of the Intl. Symposium on Fault Tolerant Computing, pp. 118–125, Jun. 1989.

D. Knapp, et al., "Behavioral Synthesis Methodology for HDL–Based Specification and Validation," 32nd Design Automtion Conf., pp. 286–291, 1995.

F. Brglez, et al., "Combinational Profiles of Sequential Benchmark Circuits," In Proceedings of the International Symposium on Circuits and Systems, Portland, Oregon, May 1989.

D. Geist, et al., "Coverage–Directed Test Generation Using Symbolic Techniques," In Proceedings of the Int. Conf. on Formal Methods in CAD, pp. 143–158, Nov. 1996.

Robert B. Jones, et al., "Efficient Validity Checking for Processor Verification," pp. 2–6, IEEE, 1995.

Ivan Radivojevic, et al., "Ensemble Representation and Techniques for Exact Control–Dependent Scheduling," pp. 60–65, IEEE, 1994.

P. Wolper, "Expressing Interesting Properties of Programs in Propositional Temporal Logic," In Proceedings of the $13^{th}$ Annual ACM Symposium on Principles of Programming Languages, pp. 184–192, ACM, NY, Jan. 1986.

Anton T. Dahbura, "Formal Methods for Generating Protocol Conformance Test Sequences," Proceedings of the IEEE, vol. 70, No. 8, pp. 1317–1326, Aug. 1990.

R. P. Kurshan, "Formal Verification in a Commercial Setting," In Proceedings of the ACM/IEEE Design Automation Conf., pp. 258–262, Jun. 1997.

A. Gupta, et al., "Toward Formalizing a Validation Methodology Using Simulation Coverage," IN Proceedings of the $34^{th}$ ACM/IEEE Design Automation Conf., pp. 740–745, Jun. 1997.

Pranav Ashar, et al., "Verification of RTL Generated from Scheduled Behavior in a High–Level Synthesis Flow," ICCAD, pp. 517–524, 1998.

R. C. Ho, et al., "Validation Coverage Analysis for Complex Digital Designs," In Proceedings of the IEEE Int'l. Conf. on Computer–Aided Design, pp. 146–151, Nov. 1996.

O. Coudert, "Verification of Sequential Machines Using Boolean Functional Vectors," In L. M. J. Claesen, Editor, Proceedings of the IFIP International Workshop on Applied Formal Methods for Correct VLSI Design, Belgium, 1989, vol. II, pp. 179–196, Amsterdam, 1989.

0 in Design Automation, Directed Search. http://www.0–in.com/directed_search.html.

R. K. Brayton et al., "VIS: A System for Verification and Synthesis," Technical Report UCS/ERL M95, Electronics Research Lab, University of California, Dec. 1995.

* cited by examiner

| CIRCUIT | INITIAL # LATCHES | AFTER MPR # LATCHES | REDUCTION # LATCHES |
|---|---|---|---|
| s344 | 15 | 7 | 8 |
| s349 | 15 | 7 | 8 |
| s382 | 21 | 15 | 6 |
| s400 | 21 | 15 | 6 |
| s444 | 21 | 15 | 6 |
| s641 | 19 | 18 | 1 |
| s1196 | 18 | 16 | 2 |
| s1238 | 18 | 17 | 1 |
| s1423 | 74 | 72 | 2 |

METHOD FOR DESIGN VALIDATION USING RETIMING

I. DESCRIPTION OF THE INVENTION

IA. Field of the Invention

This invention relates to a method for abstraction of test models for validation of industrial designs using guided simulation, model checking and invariant checking. Specifically, this invention relates to a method for automatic abstractions for the test model which reduce its complexity while preserving the class of errors that can be detected by a reachability test. The invention comprises a method of Maximal Peripheral Retiming (MPR), where the number of internal (non-peripheral) latches is minimized via retiming and some latches at the periphery are removed. The invention is embodied in a method for generating test models that has been shown to be practical by providing a detailed case study, as well as experimental results of applying this abstraction on a set of benchmark circuits.

IB. Background of the Invention

Large industrial designs are commonly validated using test sequences. In a typical methodology, a test model is derived from the design, and test sequences are generated from it by using formal verification techniques. These test sequences, which satisfy certain coverage criteria, are then used for functional simulation. A popular conventional method comprises generating test sequences by performing a transition tour on the state space of the test model, thereby guaranteeing complete transition coverage for it. In practice, such a method has been shown to be effective in uncovering errors that are otherwise difficult to find. See R. C. Ho, C. H. Yang, M. A. Horowitz, and D. L. Dill, "Architecture validation for processors", *Proceedings of the 22 $^{nd}$ Annual International Symposium on Computer Architecture*, June 1995.

A primary conventional methodology for design validation is simulation of functional models of design. There are at least two major problems with using such an approach. The first is for any reasonable coverage of possible behaviors of the design, a substantial amount of computational resources are required. The second is that such an approach lacks any formal measure of this coverage.

However, exhaustive simulation is beyond practical limits. Therefore, enhancing the quality of the simulation test set becomes important. In response to this, formal verification is emerging as a no-test-vectors validation methodology. In such a formal verification method, a formal proof of correctness covers the entire space of tests. But, while recent advances in formal verification are promising, they tend to have limited applicability.

A key barrier to the complete adoption of formal verification techniques is the very large state space associated with most designs. The use of implicit state traversal techniques has significantly extended these limits. For more details, see J. R. Burch, E. M. Clarke, D. E. Long, K. L. McMillan, and D. L. Dill, Symbolic model checking for sequential circuit verification, *IEEE Transactions on Computer-Aided Design*, 13(4):401–424, April 1994; O. Coudert, C. Berthet, and J. C. Madre, Verification of sequential machines using Boolean functional vectors, L. M. J. Claesen, editor, *Proceedings of tile IFIP International Workshop on Applied Formal Methods for Correct VLSI Design, Belgium*, 1989, volume 11, pages 179–196, North-Holland, Amsterdam, 1989; and H. J. Touati, H. Savoj, B. Lin, R. K. Brayton, and A. Sangiovanni-Vincentelli, Implicit state enumeration of finite state machines using BDDs, *Proceedings of the IEEE International Conference on Computer-Aided Design*, pages 130–133, IEEE Computer Society Press, Los Alamitos, Calif., 1990.

Nonetheless, there continues to be a significant gap between the capabilities of conventional formal verification techniques and the practical requirements imposed by them.

Recently there has been a great interest in hybrid techniques. These hybrid techniques combine the relative strengths of formal verification on one hand and simulation on the other. A popular hybrid methodology is based on using formal techniques to ensure some form of simulation coverage. It comprises first deriving a formal model of the design, typically a finite state model (FSM), hereafter called the test model. Then techniques similar to those used in formal verification (e.g. symbolic state space traversal) are used for generation of a set of test sequences. Finally, this test set is used as stimuli for functional simulation of the entire design, which can be used for either specification validation, or for comparison of an implementation against a given specification. A schematic for the such an application is shown in FIG. 1.

The test set is selected such that it has certain coverage properties with respect to the test model. These models could include—for example, coverage of each state, or coverage of each transition, or coverage of each pair-arc. For more details, see Y. Hoskote, D. Moundanos, and J. A. Abraham, Automatic extraction of the control flow machine and application to evaluating coverage of verification vectors, *Proceedings of the IEEE International Conference on Computer Design*, pages 532–537, October 1995; H. Iwashita, S. Kowatari, T. Nakata, and F. Hirose, Automatic test program generation for pipelined processors, *Proceedings of the IEEE International Conference on Computer Design*, pages 580–583, October 1994; D. Geist, M. Farkas, A. Landver, Y. Lichtenstein, S. Ur, and Y. Wolsfthal, Coverage-directed test generation using symbolic techniques, *Proceedings of the Conference on Formal Methods in CAD*, pages 143–158, November 1996; R. C. Ho, C. H. Yang, M. A. Horowitz, and D. L. Dill, Architecture validation for processors, *Proceedings of the 22nd Annual International Symposium on Computer Architecture*, June 1995; and Y. Hoskote, D. Moundanos, and J. A. Abraham, Automatic extraction of the control flow machine and application to evaluating coverage of verification vectors, *Proceedings of the IEEE International Conference on Computer Design*, pages 532–537, October 1995.

Several conventional variations on aspects of the hybrid theme have also been proposed. In one such variation, the coverage criteria used in the hybrid theme is used to evaluate the quality of a given test set or to drive the search for additional test sequences that fill in the gaps. Instead of building a separate test model, such measures are also used directly during simulation to provide partial coverage of the state space for checking invariants. For details, see J. Yuan, J. Shen, J. Abraham, and A. Aziz, On combining formal and informal verification, *Proceedings of the International Conference on Computer-Aided Verification*, volume 1254 of *Lecture Notes in Computer Science*, pages 376–387, Springer-Verlag, New York, June 1997.

Other related techniques use property-specific models, instruction templates, and HDL descriptions for generation of the test sets. See D. Lewin, D. Lorenz, and S. Ur, A methodology for processor implementation verification, *Proceedings of the Conf. on Formal Methods in CAD*, pages 126–142, November 1996; A. K. Chandra, V. S. Iyengar, D.

Jameson, R. Jawalekar, I. Nair, B. Rosen, M. Mullen, J. Yoor, R. Armoni, D. Geist, and Y. Wolfsthal, Avpgen—a test case generator for architecture verification, *IEEE Transactions on VLSI Systems*, 6(6), June 1995; and K. Cheng and A. Krishnakumar, Automatic functional test generation using the extended finite state machine model, *Proceedings of the 30th ACM/IEEE Design Automation Conference*, pages 86–91, June 1993.

While most prior art methodologies based on simulation coverage have been shown useful for detection of design errors, there is no teaching on how coverage measures on the test model translate to coverage of design errors.

There has been some recent work on identifying requirements under which a transition tour (a test set that covers each transition) on a test model can be used for covering all design errors with respect to a given specification. See A. Gupta, S. Malik, and P. Ashar, Toward formalizing a validation methodology using simulation coverage, In *Proceedings of the 34th ACM/IEEE Design Automation Conference*, pages 740–745, June 1997; and See A. T. Dahbura, K. K. Sabnani, and M. U. Uyar, Formal methods for generating protocol conformance test sequences, *Proceedings of the IEEE*, 78(8): 1317–1326, August 1990.

Furthermore, the derivation of the test model remains largely ad-hoc. Importantly, very few formal guidelines have been provided for such a derivation. For example, for processor validation, the datapath in the design is typically abstracted out and only the controller portion is retained in the test model. Beyond the datapath abstraction, most efforts in this direction have gone only so far as to designate certain state bits as more "interesting", thereby ensuring the associated partial coverage. For details, see D. Geist, M. Farkas, A. Landver, Y. Lichtenstein, S. Ur, and Y. Wolsfthal, Coverage-directed test generation using symbolic techniques, In *Proceedings of the Conf. on Formal Methods in CAD*, pages 143–158, November 1996 and J. Yuan, 1. Shen, I. Abraham, and A. Aziz, On combining formal and informal verification, In *Proceedings of the Int Conf. on Computer-Aided Verification*, volume 1254 of *Lecture Notes in Computer Science*, pages 376–387. Springer-Verlag, New York, June 1997.

There has been some work on state space abstraction based on equivalence of output control signals as seen by the datapath. For details, see R. C. Ho and M. A. Horowitz, Validation coverage analysis for complex digital designs, In *Proceedings of the IEEE international Conference on Computer-Aided Design*, pages 146–151, November 1996. The same work also describes the use of don't-cares obtained by automatic HDL description analysis, and the use of over-approximation for handling state space explosion. However, the underlying goal was still improvement in the state/transition coverage metric, without relating it to design error coverage in any way.

It is important to note that the success of abstraction in the area of formal verification is predicated on a clear formulation of the correctness criteria. For details, see R. P. Kurshan., Formal verification in a commercial setting, In *Proceedings of the ACM/IEEE Design Automation Conference*, pages 258–262, June 1997; D. E. Long., *Model Checking, Abstraction and Modular Verification*. PhD thesis, School of Computer Science, Carnegie Mellon University, Pittsburgh, Pa., July 1993; and P. Wolper., Expressing interesting properties of programs in propositional temporal logic, In *Proceedings of the Thirteenth Annual ACM Symposium on Principles of Programming Languages*, pages 184–192, ACM, New York, January 1986.

Once such criteria exist, it is possible to reason about their preservation by use of appropriate abstractions. Since most efforts using guided simulation have concentrated only on state/transition coverage, without relating these to error coverage of the original design, there is hardly any notion of preserving correctness. This, in turn, has made it hard to use abstraction effectively, except to provide partial coverage of the states/transitions.

Despite the above advances, prior art has failed to provide a method for deriving and abstracting of test models suitable for validation of large industrial designs using guided simulation.

II. SUMMARY OF THE INVENTION

The present invention provides a notion of correctness of the abstraction. Correctness of the abstraction implies completeness of the transition tour error coverage of the abstract test model with respect to the original design. Such an abstraction is correct if it preserves coverage of those errors that can be captured by a transition tour. In other words, the test sequences generated from a transition tour on the abstract test model should cover the complete set of those design errors that are covered by test sequences generated from any transition tour on the original design.

A transition tour methodology is used in the present invention since it is the most prevalent mode of generating test sequences. This notion can be potentially extended to other modes and applications as well.

The invention also includes applications to model checking and invariant checking. An error is detected in model checking or invariant checking by demonstrating the reachability of a particular state which causes incorrect behavior. These states may cause incorrect behavior by virtue of their presence in undesirable loops or because specific logic expressions to have incorrect values. A property of the retiming based abstraction technique is that reachability of states is preserved. Consequently, an error that was detected as a result of performing model checking on the original model will also be detected by model checking on the abstract model.

The applicability of the invariant checking follows from the same reasoning as for model checking. An invariant is a property (a logic expression or a model complex relationship between variables that should hold at all times). Checking an invariant also involves ensuring that states that can cause the property to be violated are never reached. The method of the present invention also works for reachability in general.

In particular, the use of Maximal Peripheral Retiming (MPR) as an abstraction which satisfies this correctness property under certain conditions is provided. In general terms, an MPR is a retiming where as many state elements as possible are moved to the periphery of the circuit. Consequently, there are as few internal state elements as possible. In the present specification the term "latches" to refer to all forms of state elements (latches/registers/flipflops).

Once MPR has been done, latches that are at the periphery of the circuit are candidates for removal in order to obtain the abstract test model, thereby potentially reducing its complexity. Intuitively, a subcircuit consisting only of peripheral latches can be safely removed if it contains no errors, because it does not affect the detection of errors in rest of the circuit. Under this condition, it is shown that the abstraction is correct, i.e. any design error that can be uncovered using the original design can also be uncovered using the simpler abstract test model. The practical importance of this abstraction is in the significant reduction in the number of latches, and thereby the complexity of validation.

To overcome the problems in conventional methodologies it is an objective of this invention to provide a method for deriving and abstracting of test models suitable for validation of industrial designs.

Specifically it is an object of this invention to provide a method for automatic abstraction of the test model that reduces its complexity while preserving the class of errors that can be detected by a reachability analysis.

To achieve the objects of the present invention there is provided a method for design validation comprising: generating a state-based test model of the design; retiming said test model to produce a retimed test model; abstracting said retimed test model to produce an abstracted test model; and applying validation technique on the abstracted test model.

Preferably the validation technique used is model checking.

Preferably the validation technique used is invariant checking.

Preferably the validation technique used is guided simulation using test sequences generated from the abstracted test model.

Preferably the test model is retimed by Maximal Peripheral Retiming, which minimizes the number of internal latches.

Preferably the retimed test model is abstracted by removing of correctly positioned peripheral latches.

Still preferably, the test sequence generation is done based on transition tour coverage for guided simulation.

Still preferably the method further comprises using a conventional retiming procedure for retiming of said test model wherein in said conventional retiming procedure the bus width of each input and output is taken to be zero.

Still preferably, the method further comprises using a conventional retiming procedure for retiming of said test model wherein:

a dummy node $D_1$ is added to the circuit with fanout to each of the primary inputs $I_i$; and a dummy node $D_0$ is added with no fanin and a single fanout to $D_1$ wherein buswidths corresponding to edges are as follows:

for edge $(D_0, D_1)$ buswidth is 0, for edge $(D_1, I_1,)$ buswidth is infinite, for outer periphery edges buswidth is 0, and for all other edges, buswidth is same as in original circuit.

Still preferably all correctly positioned output peripheral latches, and an equal number of correctly positioned input peripheral latches on all inputs are removed.

III. BRIEF DESCRIPTION OF THE DRAWINGS

The above objectives and advantages of the present invention will become more apparent by describing in detail preferred embodiments thereof with reference to the attached drawings in which:

FIG. 13 shows Table 1 showing reduction in the number of latches using the techniques of the present invention.

IV. DETAILED DESCRIPTION OF THE PREFERRED EMBODIMENTS

The present invention provides methods for derivation of the test model and the use of design abstractions to reduce its complexity.

The application of MPR according to the embodiment of the present invention will be illustrated below on a case study of the controller of a pipelined implementation of the DLX processor. Empirical evidence of its practical efficacy will be demonstrated using a set of benchmark circuits.

First, it will be shown how retiming is used to abstract state from the test model of a circuit according an embodiment of the present invention. This is followed by the formulation of the general MPR problem and its solution, as defined by an embodiment of the present invention. Next, a detailed case study of a DLX processor, followed by experimental results of applying MPR to a set of benchmark circuits will be presented.

IVA. Retiming for Abstraction

Figure 2A:
FIG. 2 shows examples of legal and illegal retimings.
Figure 2B:
Figure 2C:

Retiming is the process of repositioning latches across the combinational logic in a sequential circuit so as to minimize the clock period, the number of latches, or to meet a given clock period while minimizing the number of latches. Polynomial time algorithms for these were introduced by Leiserson and Saxe. For details on these algorithms, see Charles E. Leiserson and James B. Saxe, Retiming Synchronous Circuitry, *Algorithmica*, 6(1):5–36, 1991. By definition, retiming preserves the I/O behavior of the original sequential circuit. FIG. 2 gives examples of legal and illegal retimings.

IVA1. Definitions

For the purpose of describing the preferred embodiments of the present invention, the following definitions will be used:

Definition 1

An input peripheral latch $p_i$ is a latch whose fanin q is either a primary input or the output of another input peripheral latch, such that q fans out only to $p_i$.

Intuitively, input peripheral latches are located at the input periphery of a circuit, such that no fanin signal to these latches is directly used by rest of the logic. In other words, the application of primary inputs is merely delayed by these latches.

Definition 2

An output peripheral latch $p_o$ is a latch which fans out only to either primary outputs or other output peripheral latches.

Output peripheral latches are located at the output periphery of a circuit, such that no fanout signal from these latches is directly used by rest of the logic. Again, these latches merely delay the availability of primary outputs.

Definition 3

An internal latch $l_{int}$ is a latch which is neither an input peripheral latch, nor an output peripheral latch.

Figure 3:
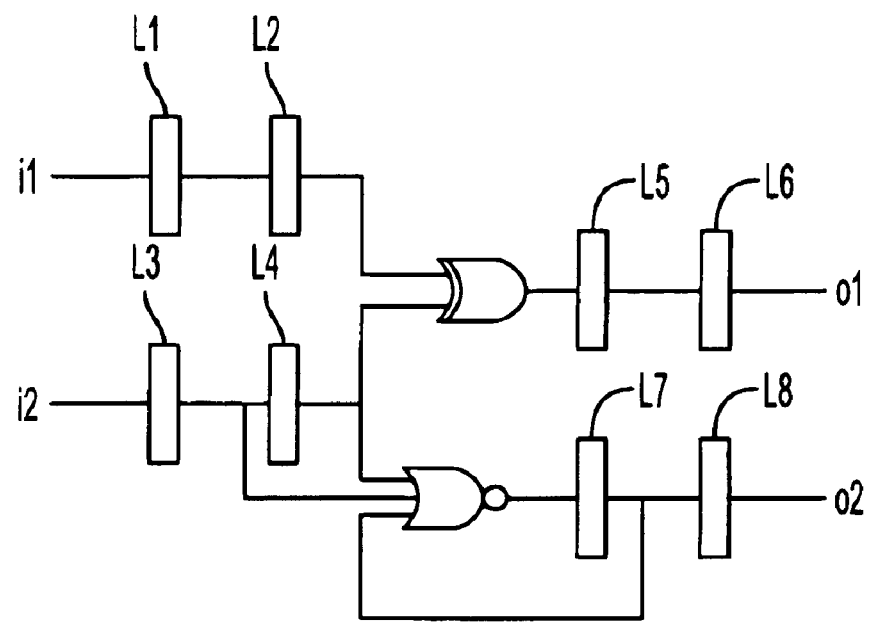
FIG. 3 shows examples of peripheral latches.

Clearly, these latches determine the reachability of the state space associated with a circuit. As an example, in the circuit shown in FIG. 3, latches L1, L2, L3 are input peripheral latches, latches L5, L6, L8 are output peripheral latches, and L4, L7 are internal latches.

IVA2. Design Errors and Transition Tours

A design implementation is considered to have an error with respect to its specification if the implementation produces an incorrect output for some input sequence. In general, a transition tour cannot capture all errors, since it covers all single transitions only, and not all transition sequences.

Figure 4:
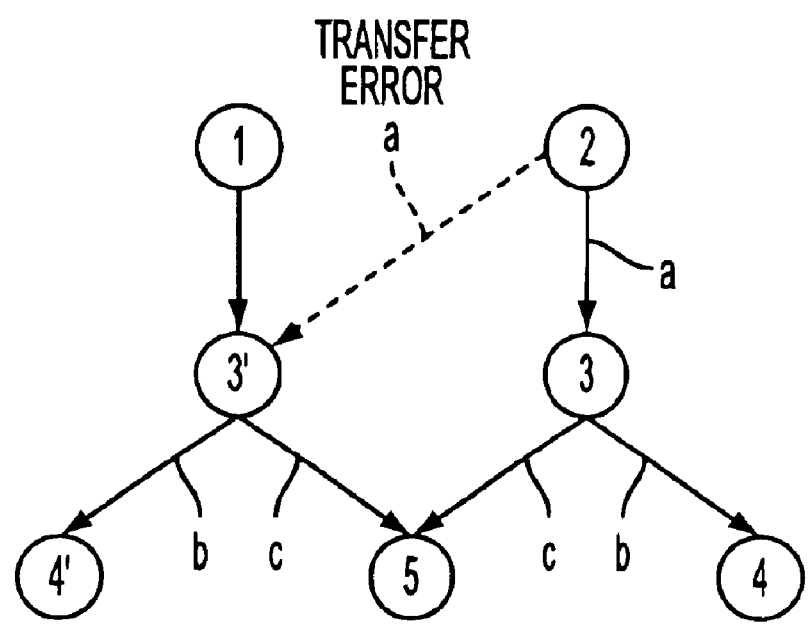
FIG. 4 shows an example illustrating the limitations of transition tours.

For example, consider the state transition graph shown in FIG. 4. Suppose there is an error in the transition from State 2 to 3 on input a, where it is incorrectly implemented as a transition from State 2 to 3'. Let the transitions on input b, from State 3 to 4 and from State 3' to 4', result in different outputs during simulation. Also, let the transitions on input c, from Slate 3 to 5 and from State 3' to 5 result in the same outputs during simulation. Therefore, if a transition tour uses the sequence <a, c>, the error on transition with input a can get detected on the next transition itself. On the other hand, if a transition tour uses the sequence <a, b>, the error will not get detected on the next transition, and may never get detected at all. This illustrates the basic limitation of using transition tours—an error may get detected several transitions after it is excited, and only along a specific path in the state transition graph. If this path is not selected in the transition tour, the error will not be covered. Furthermore, depending on what particular paths are selected, different transition tours may cover different sets of errors.

IVA3. Correctness of Abstraction

It should be noted that the present invention is not restricted to a particular type of transition tours. In order to not tie the analysis to a particular choice of a transition tour, for the rest of this specification, the focus is on those errors that can be covered by any transition tour of a given design implementation.

Based on the above observations, it is clear that such an error can be detected as a difference in the observed output on a transition from a state, regardless of how that state was reached. Thus, it can be shown that reachability of states is preserved by the abstraction used in the present invention. The analysis is also not restricted to systems with special properties that allow all errors to be covered by a transition tour. See A. Gupta, S. Malik, and P. Ashar. Toward formalizing a validation methodology using simulation coverage. In *Proceedings of the 34th ACM/IEEE Design Automation Conference*, pages 740–745, June 1997.

The following definitions are uses as criteria for correctness of an abstraction in this context:

Definition 4

Transition tour error coverage completeness: A model T has transition tour error coverage completeness with respect to another model D, if all errors in D which can be covered by any transition tour on D, are also errors in T and can be covered by some transition tour on T Definition 5

An abstraction A is correct if the abstract test model T=A(D) has transition tour error capture completeness with respect to the original implementation D.

IVA4. Retiming and Removal of Peripheral Latches

To achieve its goals, the present invention focuses on a special class of retiming called Maximal Peripheral Retiming (MPR). The formal statement of the problem, and an outline for its solution are described below. Once MPR has been performed on the given design, the following two kinds of abstractions are considered for obtaining the test model:

$A_{eq}$: Removal of all output peripheral latches, and removal of an equal number of input peripheral latches across all inputs.

$A_{neq}$: Removal of all output peripheral latches, and removal of all (potentially non-equal) number of input peripheral latches across all inputs.

It is shown herein that these abstractions are correct according to the criteria described in the previous section, i.e. the abstractions preserve detection of errors covered by any transition tour in the original design implementation. This is true under certain conditions. The intuitive explanation is described here, with proofs to follow in the next section.

Note that the I/O-preserving nature of a retiming transformation itself guarantees that an error observed on a transition from a reachable state s in the original circuit will be preserved as a corresponding error from an equivalent state s' in the retimed circuit. The main insight here is that the removal of a peripheral latch (either input or output) does not affect the presence of such an error, provided the latch was correctly positioned to start with. This is because, in a correct design, the position of a peripheral latch implies that it can not affect the value of an output (only its timing), which can be determined strictly from rest of the circuit. Thus, all errors in the subcircuit with internal latches are preserved by the abstract circuit Furthermore, a transition tour on the abstract circuit will eventually reach (given the initial conditions) and cover the erroneous transition. More formally, it can be said that a peripheral latch is correctly positioned if it has been separately validated that this position of the latch at the circuit periphery is consistent with intended behavior.

In some sense, the burden of checking design correctness is decomposed into:

(i) detecting errors in the peripheral latches, and (ii) detecting errors in rest of the circuit.

It can be shown that the former task can be handled separately, and in some cases more efficiently, than the latter. Consider the case where an RTL specification is available. In this case, first perform an MPR on the specification. As described later, one can arrange it so that such a retiming results in a unique configuration of the peripheral latches. Thus, the peripheral latches of the retimed implementation after MPR contain no errors only if their configuration matches exactly the configuration of the peripheral latches in the retimed specification after MPR. In fact, if the match fails, one can easily obtain a counter-example which exhibits the difference between the two.

For cases where an RTL specification is not available, one could still use the knowledge of the designer/verification expert in certifying that the positioning of the peripheral latches is correct. In practice, especially in pipelined design implementations, many peripheral latches are already at the periphery in the original design itself. i.e. without having performed MPR. For example, as described in our case study of the DLX controller (Section IVC), 63 of the final 72 peripheral latches were already at the periphery before MPR.

In most cases, the correctness of these latches is easy to justify intuitively. However, the situation is somewhat trickier for latches that are moved to the periphery from some internal position after performing MPR. In these cases, one has to depend on input from either the designer, or some higher level analysis. For example, if a behavior level specification is available, one can perform an analysis for each output to capture its dependence on the relative time instances of each input (rather than its functional dependence) in order to infer some structural latch relationship in the corresponding RTL description.

Basically, it is first ensured that the peripheral latches are positioned correctly. This can be done either automatically for RTL specifications by using MPR itself, or manually through input from the designer. Then, the remaining circuit is handled by using the same transition tour techniques as before, but with potentially reduced complexity due to a smaller model.

IVA5. Proof of Correctness

The following Theorems 1–3 provide a basis for the present invention and its embodiments:

Theorem 1

Removal of correctly positioned output peripheral latches preserves reachability error and thereby detection.

Proof:

The only purpose served by the output peripheral latches is to buffer the primary outputs, which affects only the timing when the outputs are ready to be observed during simulation. In particular, for an output O from which $n_{po}$ output peripheral latches have been removed, the result should be observed with a delay of $n_{po}$ cycles during simulation on the original. It is clear that removal of these latches has no impact on either the state space visited during the transition tour, or on its input sequences, thereby preserving reachability and detection of errors.

Theorem 2

Removal of an equal number of correctly positioned input peripheral latches across all inputs preserves error detection.

Proof:

For the abstract model, let $n_{pi}$ be the number of input peripheral latches removed from all inputs. Given m inputs, let $I_{i,j}$, $1 \leq i \leq m$, $1 \leq j \leq n_{pi}$ denote the initial value on the $j^{th}$ input peripheral latch for the $i^{th}$ input, as shown in FIG. 4. Note that the circuit blocks marked C and C' in the two models are identical. Let state s be reachable by an input sequence $\Sigma$ in the original model. Then, there exists an equivalent state s' reachable in the abstract model by the input sequence $\Sigma'=\sigma_1, \sigma_2, \ldots, \sigma_{npi}, \Sigma$, where $\sigma_j$ is the input vector $I_{1,j} I_{2,j} \ldots I_{m,j}$. Since s and s' are equivalent, if there is an error from state s on input a, there will be an error from state s' on input a. Furthermore, since all reachable states and all transitions from those states are covered by a transition tour, this error will be detected by any transition tour on the abstract model with $\sigma_1, \sigma_2, \ldots, \sigma_{npi}$ as a prefix. Finally, during simulation on the original design, $\Sigma'$ should be padded by $n_{pi}$ dummy inputs at the end, in order to account for the delay due to the original input peripheral latches with respect to the observed outputs.

Theorem 3 Removal of all correctly positioned input peripheral latches preserves error detection for the circuit.

Figure 5:
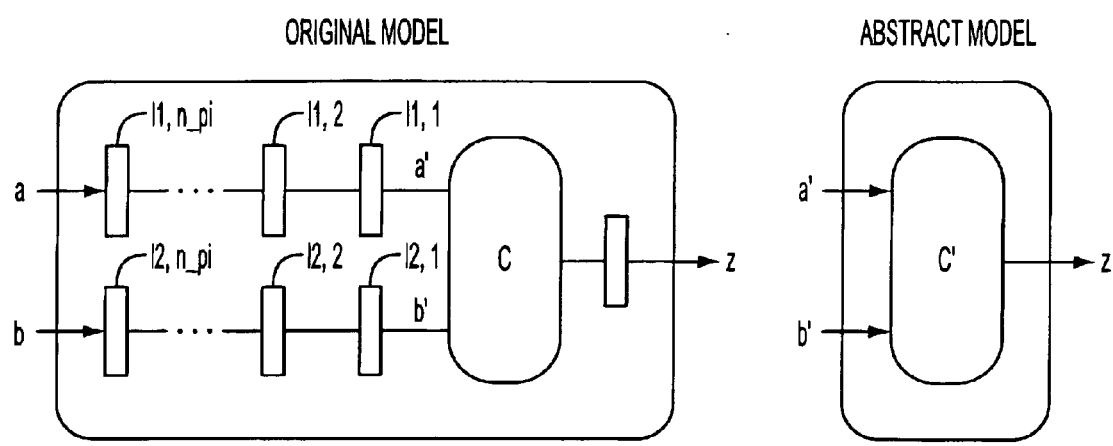
FIG. 5 shows diagrams illustrating correctness of $A_{eq}$ abstraction.
Figure 6:
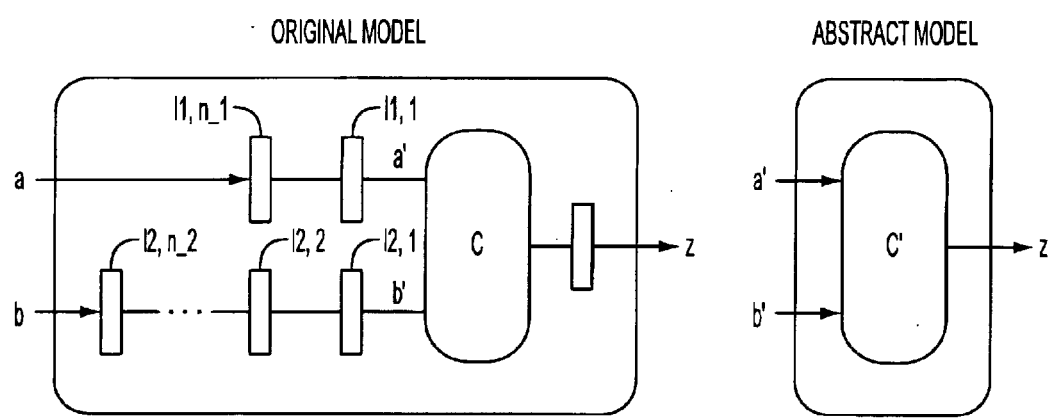
FIG. 6 shows diagrams illustrating correctness of $A_{neq}$ abstraction.

Proof:

For the abstract model, let $n_i$ be the number of input peripheral latches removed from the $i^{th}$ input. Given m inputs, let $I_{i,j}$, $1 \leq i \leq m$, $1 \leq j \leq n_i$ denote the initial value on the $j^{th}$ input peripheral latch for the $i^{th}$ input, as shown in FIG. 5. Again, note that the circuit blocks marked C and C' in the two models are identical.

Now consider a state s reachable by an input sequence $\Sigma=\sigma_1, \sigma_2, \ldots, \sigma_r$ in the original model, where each $\sigma_k=\sigma_{1,k}\sigma_{2,k}\ldots\sigma_{m,k}$ denotes the vector of inputs 1 through m. Due to the equivalence of blocks C and C', there exists an equivalent state s' reachable in the abstract model by the input sequence $\Sigma'=\sigma'_1, \sigma'_2, \ldots, \sigma'_{r+max(ni)}$, where $\sigma'_k=\sigma'_{1,k}\sigma'_{2,k}\ldots\sigma'_{m,k}$ is the input vector constructed in such a way that:

$$\sigma'_{i,k} = I_{i,k} \quad \text{if } k \leq n_i \text{ and}$$
$$= \sigma_{i,k-ni} \quad \text{if } n_i < k <= r+n_i$$
$$= - (\text{don't care}) \quad \text{if } k > r+n_i$$

Since s and s' are equivalent, if there is an error from state s on input a, there will be an error from state s' on input a. Furthermore, since all reachable states and all transitions from those states are covered by a transition tour, this error will be detected by a transition tour (with the appropriate prefix) on the abstract model. Again, during simulation on the original design, $\Sigma'$ should be padded by $max(n_i)$ dummy inputs at the end, in order to account for the delay due to the original input peripheral latches with respect to the observed outputs.

From Theorems 1, 2 and 3, it is straightforward that both the abstractions $A_{eq}$, and $A_{neq}$, when limited to removal of correctly positioned latches, preserve reachability and thereby error detection by a transition tour. Note that in practice $\Sigma$ is not known apriori, since performing a transition tour on the original model should be avoided. Instead, during generation of the transition tour $\Sigma'$ on the abstract test model, the initial prefix captures the constraints imposed by the initial values of those input peripheral latches that are removed by the abstraction. This ensures that only the reachable part of the original state space is explored by the transition tour on the abstract state space.

Note that though the analysis has been presented in terms of abstraction from the original design implementation to a test model, it also holds for abstraction from any concrete test model to an abstract one. This can be quite useful in the context of a guided simulation methodology, where the concrete test model may itself be the result of abstracting the design implementation in some form. For example, for processor verification, a popular abstraction is to remove the datapath elements from the RTL design, and focus on the resulting controller. Naturally, in this case, the usefulness of our abstraction will depend on the extent to which design errors are contained in the concrete test model to start with.

Figure 1:
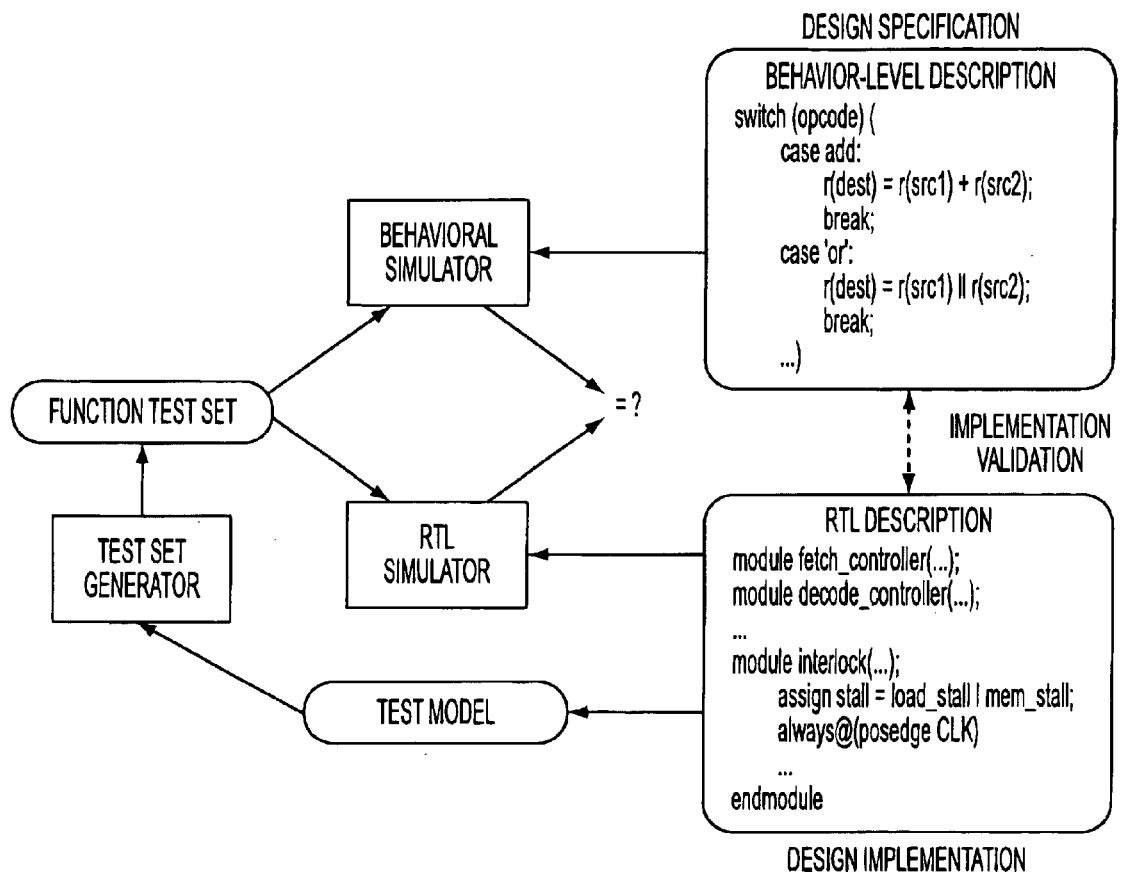
FIG. 1 shows a diagram illustrating a validation methodology using guided simulation.

The reason for differentiating between the two kinds of abstractions stems from the following methodological consideration. Consider the case where the test sequences generated from a transition tour of the abstract test model are used for simulation comparison between the RTL and behavior level descriptions, as shown in FIG. 1. Note that in the use of the, $A_{neq}$, abstraction, the input vectors generated by a transition tour on the abstract test model do not correspond directly to input vectors applied to the original design. In fact, values from different input vectors in the abstract test sequence have to be put together to obtain an input vector for the original design sequence (inverse of $\Sigma'$ in the proof of theorem 3). Such a "jumbled-up" input vector at the RTL may not correspond to any obvious input scenario at the behavior level, thereby making it harder to ascertain the expected results. For example, in the case of processor verification, a jumbled-up input vector at RTL may consist of opcode bits from one vector, and register address bits from another, potentially leading to an invalid instruction input at the behavior level. However, if we use $A_{eq}$, all inputs in the abstract vector sequence are delayed by the same amount when applied to the original. Thus input vectors are preserved across the various models, facilitating their use in simulation.

The description below will consider algorithms for MPR under both scenarios—abstraction of both equal and unequal input peripheral latches.

IVB. Maximal Peripheral Retiming

IVB1. Peripheral Retiming

The notion of moving the latches to the boundary of the circuit is related to the concept of peripheral retiming. For details on peripheral retiming see S. Malik, E. Sentovich, R. K. Brayton, and A. Sangiovanni-Vincentelli, Retiming and resynthesis: Optimizing sequential networks with combinational techniques, *IEEE Transactions on Computer-Aided Design of Integrated Circuits and Systems*, 10(1):74–84, January 1991. Peripheral retiming was introduced to help define the maximal circuits which could be directly optimized using combinational logic techniques. More specifically, a peripheral retiming of a circuit is a retiming that results in all the latches migrating to the periphery of the circuit. This results in the remaining circuit being combinational and thus transformable by combinational logic optimization techniques. Not all circuits permit peripheral retiming, the exact conditions under which peripheral retiming is permitted were defined in S. Malik, E. Sentovich, R. K. Brayton, and A. Sangiovanni-Vincentelli, Retiming and resynthesis: Optimizing sequential networks with combinational techniques, *IEEE Transactions on Computer-Aided Design of Integrated Circuits and Systems*, 10(1):74–84, January 1991.

IXVB2. Problem Formulation

According to the goals of the present invention it is desirable to move as many of the latches to the periphery as possible. It is likely that it will not be possible to move all of them to the periphery. Thus, the specific problem that needs to be solved is not exactly peripheral retiming, though it is somewhat related. Given a circuit C, a circuit C' needs to be derived by a retiming such that the number of latches that are not at the periphery of C' are minimized. This results in a reduction in the state space (and hence transition tour) of C'. This problem is referred to as Maximal Peripheral Retiming (MPR). Two flavors of this, $MPR_{eq}$ and $MPR_{neq}$ will be considered, corresponding to the abstractions $A_{eq}$ and $A_{neq}$, respectively. In $MPR_{eq}$, only an equal number of latches at each primary input will eventually be abstracted, so the remainder must be counted as internal latches. In $MPR_{neq}$ there is no such restriction.

Note that unlike peripheral retiming, all circuits have a maximal peripheral retiming. In the worst case, if none of the latches move to the periphery, then the final circuit is the same as the initial circuit.

A similar notion is also used in reducing the complexity of automatic test pattern generation. For details on automatic test pattern generation see R. Gupta, R. Gupta, and M. A. Breuer, BALLAST: A methodology for partial scan design, *Proceedings of the International Symposium on Fault Tolerant Computing*, pages 118–125, June 1989. Here the latches that cannot be peripherally retimed are selected as partial scan latches for test purposes. Very much related to the present invention is the also work by Balakrishnan and Chakradhar which shows the application of retiming with minimizing latches in sequential test generation, along with the transformations for the test vectors induced by such retimings. See A. Balakrishnan and S. T. Chakradhar, Software transformations for sequential test generation, *Fourth Asian Test Symposium*, 1995.

IVB3. Algorithms for MPR

Extensions of standard retiming algorithms to handle $MPR_{eq}$ and $MPR_{neq}$ are straightforward. Consider $MPR_{neq}$ first. In the original retiming formulation, Leiserson and Saxe provide support for different width busses, recognizing that if the output of a module is 32 bits wide and the inputs are only 16 bit wide, then the output register costs twice as much as the input register. See Charles E. Leiserson and James B. Saxe, Retiming Synchronous Circuitry, *Algorithmica*, 6(1):5–36, 1991. A straightforward application of this to $MPR_{neq}$ is to consider the bus width of each peripheral edge (input and output) to be zero. Now, conventional retiming to minimize the number of latches in the circuit will minimize the number of internal latches by attempting to push as many as possible to the periphery since those latches have zero cost.

$MPR_{eq}$ is handled with a minor modification of a circuit before applying the above algorithm. A dummy node $D_1$ is added to the circuit with fanout to each primary inputs $I_i$. Another dummy node $D_0$ is added with no fanin and a single fanout to $D_1$. The bus width of the edges is as follows:

- for the $(D_0, D_1)$ edge it is 0
- for the $(D_1, I_i)$ edges it is infinite
- for the output periphery edges it is 0
- for all other edges, it is the same as in the original circuit.

This will force a minimization of internal latches in the circuit by trying to push as many latches to the output periphery and on the $(D_0, D_1)$ edge. Note that the latches on the $(D_0, D_1)$ edge have been obtained by retiming an equal number of latches from each of the input peripheral edges. Thus the pair of dummy nodes $(D_0, D_1)$ captures the requirement that an equal number of latches be retimed at each input peripheral edge.

There may be several peripheral retimings obtained using the above formulations. Essentially, an equal number of latches may be taken from each primary input (output) and added to each primary output (input) while preserving functionality. Since the number of latches at the primary outputs is to be maximized, the peripheral retiming can be biased in that direction by picking appropriate bus widths (e.g. 0 for output peripheral edges, 1 for input peripheral edges, and some large number greater than the maximum fanins of any gate for internal edges). This also assures a unique peripheral latch configuration, i.e. the number of latches at each peripheral edge are uniquely specified though the number of latches on internal edges may vary.

The constructions described above for $MPR_{eq}$ and $MPR_{neq}$ reduce these problems to standard retiming for minimizing the number of latches; which is a well studied problem with several efficient practical implementations.

IVB4. Handling Enables and Multiple Clocks/Phases

Figure 7:
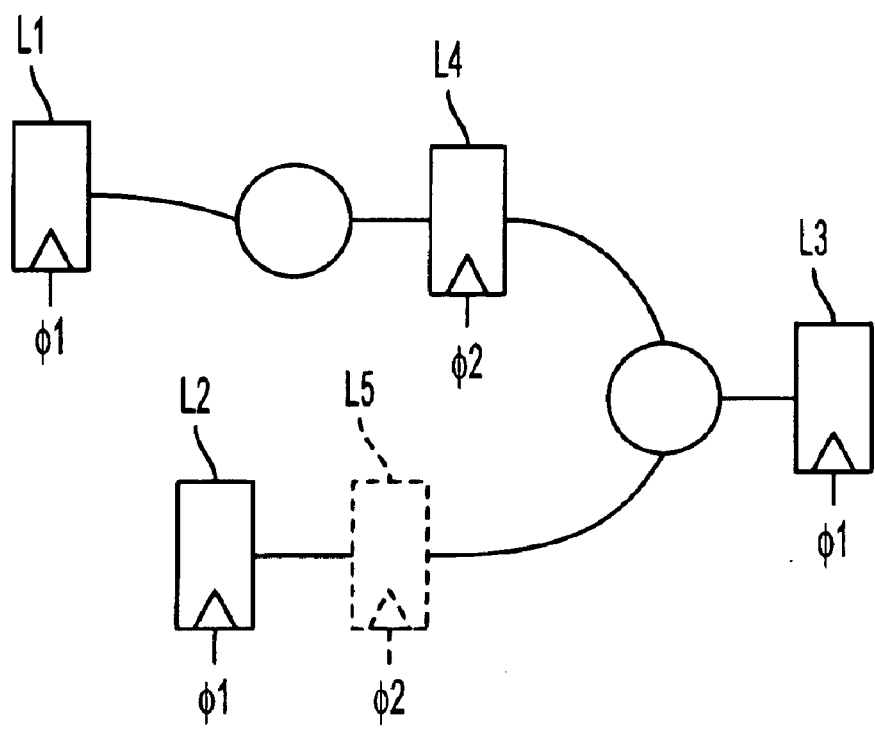
FIG. 7 shows an example circuit with multiple clocks/phases.

In practical designs, different latches may be enabled under different enable conditions and clocked by different clock signals/phases. Legl et al. consider the problem of retiming for latches with multiple clocks and enables. See C. Legl, P. Vanbekbergen, and A. Wang, Retiming of edge-triggered circuits with multiple clocks and load enables, *Notes of the International Workshop an Logic Synthesis*, May 1997. Their solution is to consider classes of latches, where each class contains all the latches with exactly the same enables and clocks. Now, latches can be retimed across a gate (backward or forward) only if they all belong to the same class. While this algorithm is correct in that it will generate a circuit functionally equivalent to the original circuit, it may be pessimistic in that it may not permit all possible retimings. Consider a multi-phase $(\phi_1, \phi_2, \ldots, \phi_n)$ clocking scheme. Let the clock period start at the leading edge of $\phi_1$. Now consider a sub-circuit as shown in FIG. 7. (In this figure, and in others to follow, the standard practice of using rectangles to indicate latches and circles to indicate combinational logic blocks is used. Also, multi-bit signals which represent a single logical signal are shown schematically with a single latch, unless explicitly stated otherwise.)

As shown, the three latches $L_1$, $L_2$, and $L_3$ are clocked by $\phi_1$, with paths from $L_1$ to $L_3$ and also $L_2$ to $L_3$. Let the path from $L_1$ to $L_3$ have a latch $L_4$ clocked by $\phi_2$. The path from $L_2$ to $L_3$ has no other latch.

Under the class based algorithm, the $L_4$ will not be able to move forward. This is obviously restrictive—a dummy latch $L_5$ can always be added, right after $L_2$, that can permit the migration of $L_4$. This does not change the logical behavior of the circuit. It does change the clock period requirement, but that is immaterial in the current application. Thus, to maximize the ability to move latches to the periphery, paths with unbalanced phases are balanced by adding dummy latches as explained above. This step was explicitly needed in the case study presented below.

IVC. Case Study: The DLX Processor

A Verilog RTL implementation (without floating-point and exception-handling instructions) of the popular DLX processor is used to show practicability of the method according to the present invention. For details on the DLX processor, see J. L. Hennessy and D. A. Patterson, *Computer Architecture: A Quantitative Approach*, Morgan Kaufmann, 1990. The DLX processor uses a standard 5-stage pipeline consisting of the fetch, decode, execute, memory and writeback stages. The design also includes an interlock module, which implements data forwarding and load interlock for data hazards, and uses a branch-not-taken strategy for handling control hazards. For the present test design, the initial test model was obtained by manual removal of the datapath is elements, and all signals pertaining to immediate data. This model is shown in FIG. 7, where the signals from/to the datapath are modeled as primary inputs/outputs, respectively. It consisted of 157 state elements, 39 primary inputs, and 40 primary outputs. Then, some generic abstractions were applied, such as considering a reduced set of registers (4 instead of 32), changing a one-hot encoded set of signals to a binary encoding, and retiming to avoid duplication of registers in the interlock module. These resulted in a test model with 92 latches, which is still beyond the capabilities for generating a transition tour.

IVC1. Abstraction Using MPR

Next, peripheral retiming was applied to abstract this model further, which yielded four interesting classes of latches, three of which could be abstracted out.

Class 1: Latches at the input periphery: In typical pipelined designs, the fetch stage simply passes on the instruction to the decode stage, without looking at its contents whatsoever. In circuit terms, the latches used by the fetch stage for storing the instruction word appear at the input periphery of the model. Furthermore, these latches share a common enable signal (−(Stall V Stall_for_.Multiply)), and are not part of any reconvergent paths. These can be abstracted out, saving 32 latches.

It is interesting to compare this abstraction to the late bifurcation technique used by Lewin et al. See D. Lewin, D. Lorenz, and S. Ur. A methdology for processor implementation verification. In *Proceedings of the Int. Conf on Formal Methods in CAD*, pages 126–142, November 1996 to abstract the fetch stage. Late bifurcation is used to break up the instruction into sections that are used appropriately by different stages of the pipeline model. However, this gives rise to the problem of consistency, i.e. ensuring that information from the same instruction persists as it advances through the different stages. They deal with this problem by requiring consistency during generation of the architectural tests from their model. In the approach used in the present invention, consistency is guaranteed implicitly by the methodology. For example, test sequences are generated from the test model in terms of inputs to the decode stage, which are applied one time step earlier with respect to the observed outputs during simulation.

Class2: Latches at the output periphery: Recall that the primary outputs of the test model, in most cases are control signals to the datapath. Pipelined designs typically use synchronizing latches on such control signals which appear at the output periphery of the test model. For the DLX design there were 31 such latches which could be abstracted out, including the entire writeback stage. Since they had a common enable (always enabled), and did not belong to any reconvergent paths, they were all abstracted out. In effect, this removed output latches from different stages and completely removed the writeback stage of the pipeline.

Figure 10:
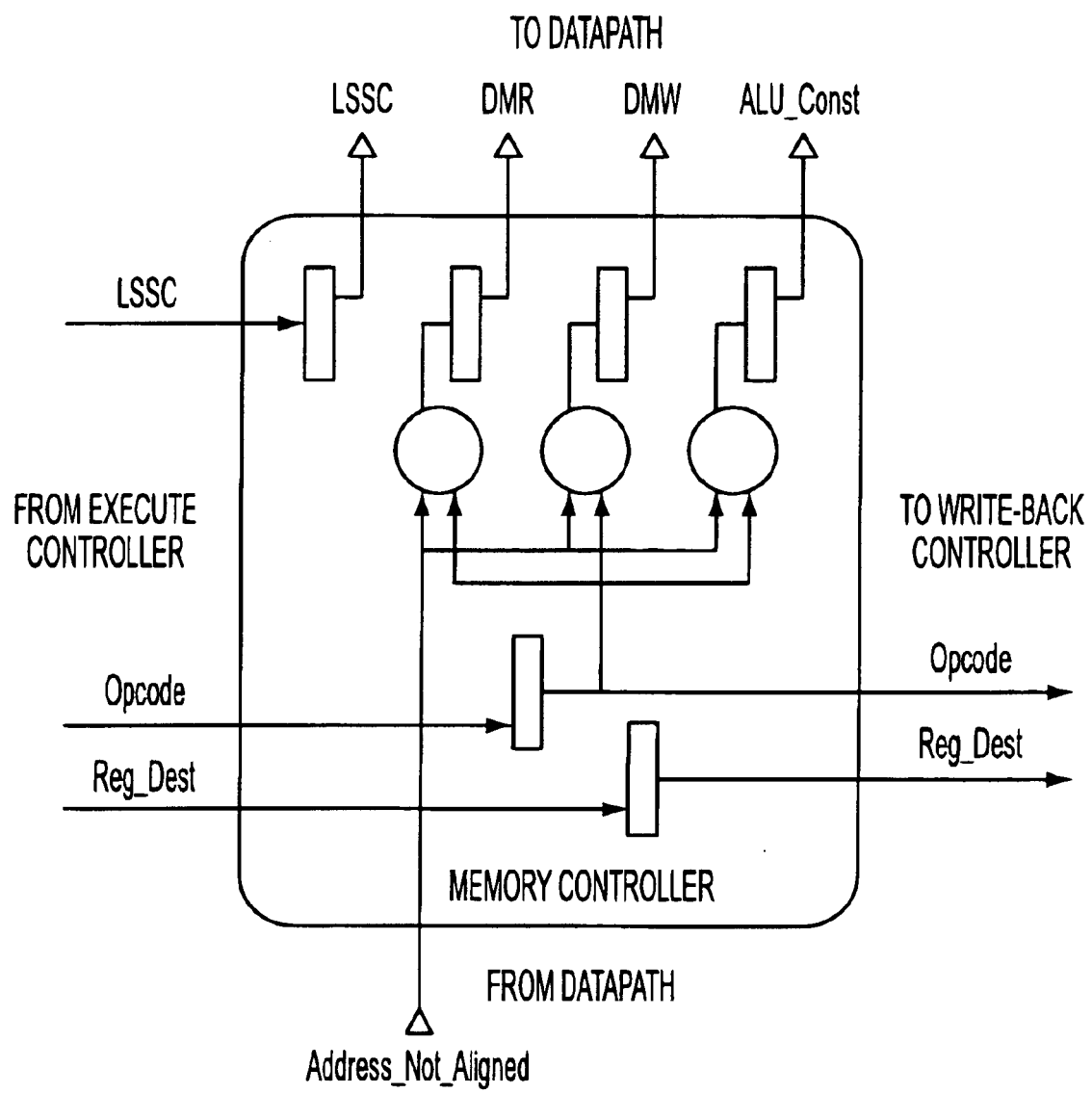
FIG. 10 shows outputs from the DLX memory stage.
Figure 11:
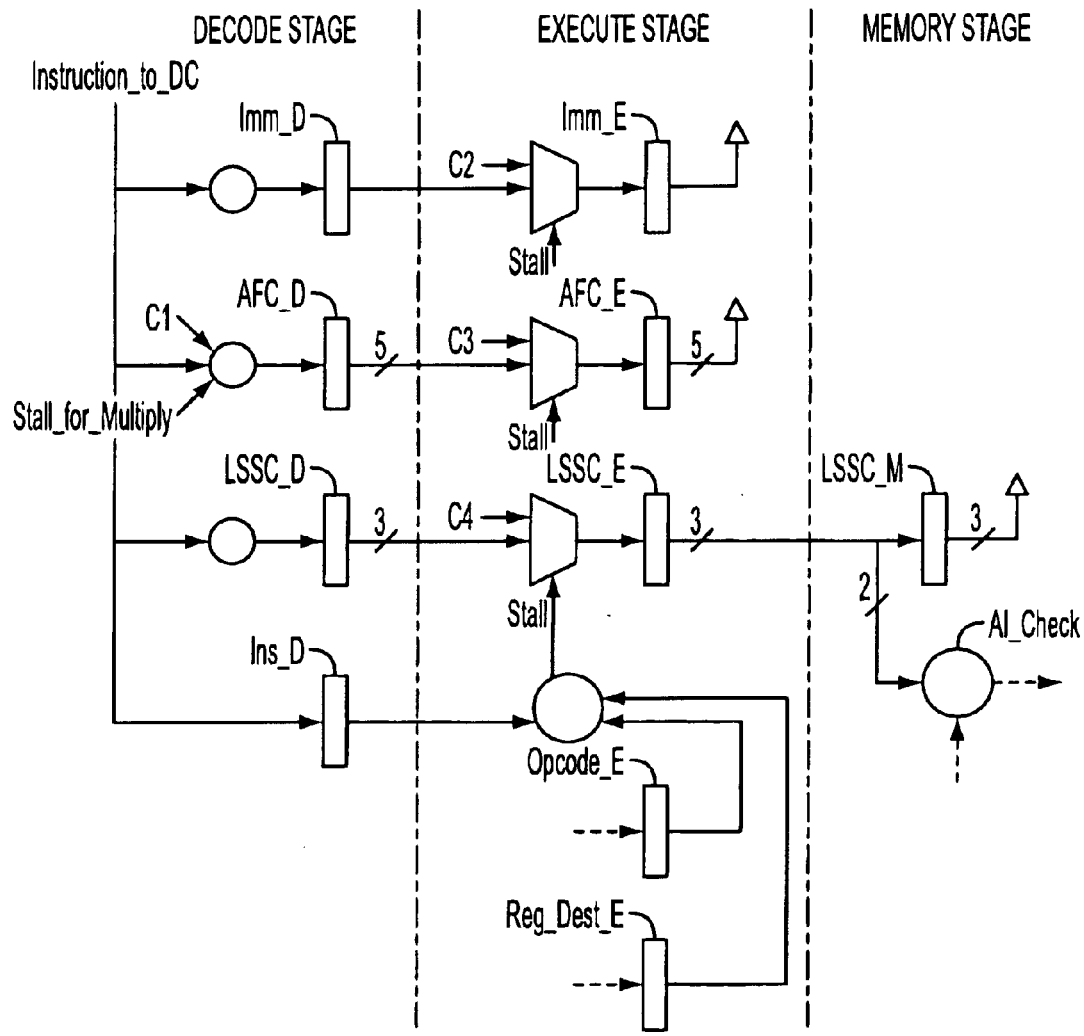
FIG. 11 shows a diagram illustrating peripherally retimable latches in the DLX.

For example, the outputs from the memory stage of our DLX design are shown in FIG. 10, where LSSC, DMR and DMW are control signals for the data memory representing the load-store size code, read, and write signals, respectively; and ALUConst is used to force the delayed ALU output register to a constant in case of an address mis-alignment. Note that the correct synchronization of these signals with rest of the datapath will be automatically checked during functional simulation.

Figure 8:
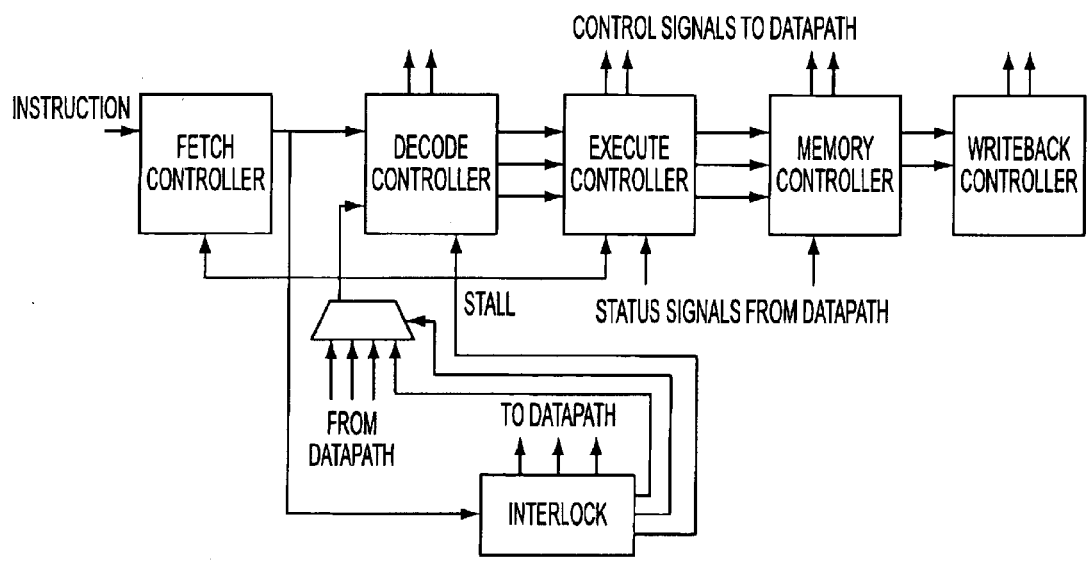
FIG. 8 shows a diagram illustrating initial test model for the DLX.
Figure 9:
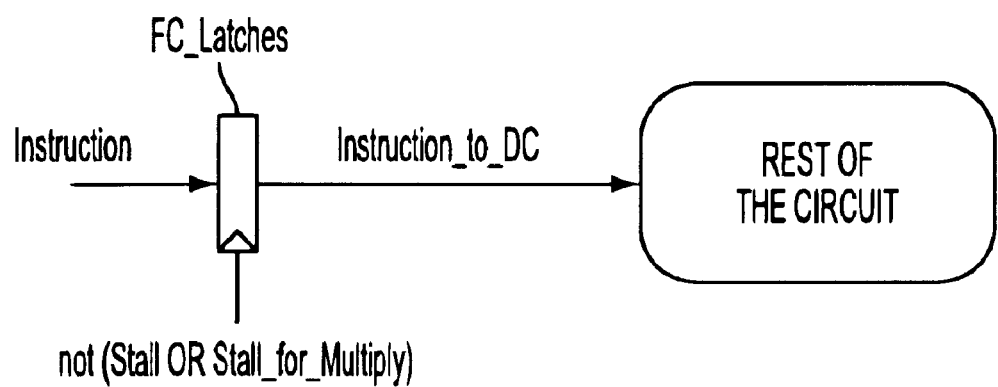
FIG. 9 shows latches in the DLX fetch stage.

Class3: Latches retimed to move to the periphery: The more interesting latches are those that are not already at the periphery, but can be moved there by retiming. For the present DLX design, savings of 8 latches were obtained from three sets of signals, as shown in FIG. 8:

Imm_Ctrl: used in the datapath to select the immediate data as the second source for the ALU.

AFC: used as the function code for the ALU in the datapath.

LSSC: represents the load-store size code for the data memory. During the process of maximal peripheral retiming, it was found that 2 of the 3 bits from LSSC_E are used by the memory stage to check for address alignment, due to which they could not be retimed forward. However, the unused bit could be moved to the periphery.

Figure 12A:
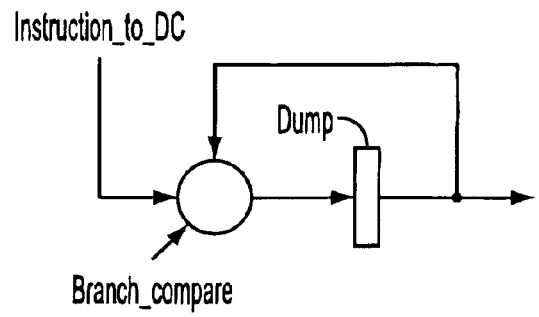
FIG. 12 shows examples of unretimable latches in the DLX.
Figure 12B:
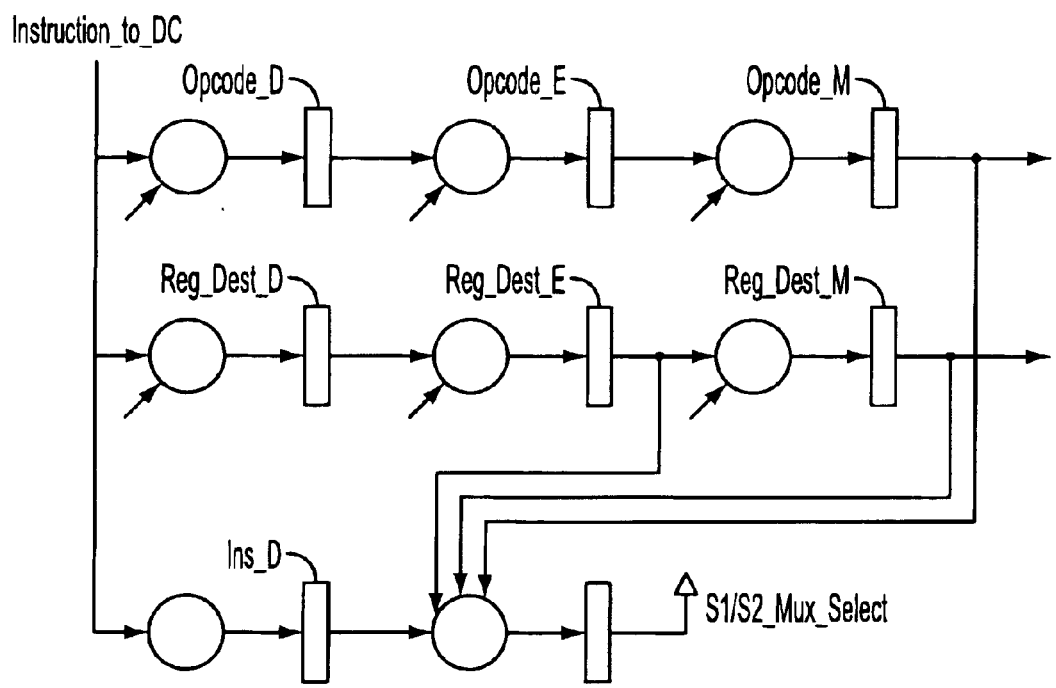

Class4: Unretimable latches: It is also interesting to examine the remaining latches which could not be peripherally retimed. There are two main structures that prevent such retiming −(i) self-loops (ii) reconvergent paths with different number of latches. Typical examples of these are shown for the DLX design in FIG. 12, where FIG. 12(*a*) shows the self-loop for Dump (for dumping the fetched instruction in case of a taken branch), and FIG. 12(*b*) shows the reconvergent structure for S1/S2_Mux_Select (used to select the ALU sources).

For the DLX design, there were 21 latches that could not be retimed to the periphery.

IVC2. Final Test Model

Of the 157 original latches, 72 were abstracted out by use of maximal peripheral retiming. Corresponding abstraction over the inputs/outputs (due to removal of immediate data fields and shortening of register addresses) resulted in a final test model of 21 latches, 25 primary inputs and 31 primary outputs. VIS was used to convert the Verilog description to an FSM description, which was further used as input to SIS. See R. K. Brayton et al., VIS: A system for verification and synthesis, Technical Report UCS/ERL M95, Electronics Research Lab, University of California, Berkeley, Calif., December 1995; also to appear in Proceedings of the Conference on Computer-Aided Verification, 1996; and E. M. Sentovich, K. J. Singh. C. Moon, H. Savoj, R. K. Brayton, and A. Sangiovanni-Vincentelli, Sequential circuit design using synthesis and optimization, *Proceedings of the IEEE International Conference on Computer Design*, 1992. Within SIS, the implicit transition relation representation of the final model was obtained in about 10 seconds on an 166 MHz UltraSparc workstation with 64 MB main memory.

IVD. MPR on Benchmark Examples

The MPR algorithms according to the present invention were applied to standard benchmark circuits from the ISCAS89 benchmark suite to estimate their effectiveness on ostensibly unstructured logic circuits from random sources. See F. Brglez, D. Bryan, and K. Kozminski, Combinational Profiles of Sequential Benchmark Circuits, *Proceedings of the International Symposium on Circuits and Systems*, Portland, Oreg., May 1989. The MPR algorithm according to the present invention was easily implemented in the SIS retiming package by assigning zero cost to any latch moving to either the primary input or primary output. See E. M. Sentovich, K. J. Singh, C. Moon, H. Savoj, R. K. Brayton, and A. Sangiovanni-Vincentelli, Sequential circuit design using synthesis and optimization, *Proceedings of the IEEE International Conference on Computer Design*, 1992. It was found that when only the same number of latches is allowed to be removed from the I/O, no reduction in the number of latches was observed using MPR, and the subsequent removal of latches at the periphery. On the other hand, when arbitrary numbers of latches were allowed to be removed from the I/O, 9 of the 23 ISCAS89 circuits for which retiming is computationally viable using the SIS retiming package showed a reduction in the number of latches with MPR followed by the subsequent removal of latches at the periphery. The results are shown in Table 1 shown in FIG. 13. This result is especially significant since these circuits represent completely unstructured random logic. Much better results can be expected on circuits with more pipelining. The experiment was carried out on a 166 MHz UltraSparc with 64 MB of main memory and took on the order of a few minutes to complete. The circuits and their latch reductions are given in Table 1.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method for validating a design of a circuit comprising:
   (a) generating a state-based test model of the design;
   (b) retiming said test model to produce a retimed test model;
   (c) abstracting said retimed test model to produce an abstracted test model; and
   (d) applying validation techniques on the abstracted test model,
   wherein while validating the design of the circuit an analysis of a functional design of the circuit is performed using test vectors generated from the abstracted test model to verify correctness of the functional design, and
   wherein the validation technique used is model checking.

2. A method for validating a design of a circuit comprising:
   (a) generating a state-based test model of the design;
   (b) retiming said test model to produce a retimed test model;
   (c) abstracting said retimed test model to produce an abstracted test model; and
   (d) applying validation techniques on the abstracted test model,
   wherein while validating the design of the circuit an analysis of a functional design of the circuit is performed using test vectors generated from the abstracted test model to verify correctness of the functional design, and
   wherein the validation technique used is invariant checking.

3. A method for validating a design of a circuit comprising:
   (a) generating a state-based test model of the design;
   (b) retiming said test model to produce a retimed test model;
   (c) abstracting said retimed test model to produce an abstracted test model; and
   (d) applying validation techniques on the abstracted test model,
   wherein while validating the design of the circuit an analysis of a functional design of the circuit is performed using test vectors generated from the abstracted test model to verify correctness of the functional design, and
   wherein the validation technique used is simulation using test sequences generated from the abstracted test model.

4. The method of claim 3 wherein the test sequence generation is done based on transition tour coverage for the simulation.

5. A method for validating a design of a circuit comprising:
   (a) generating a state-based test model of the design;
   (b) retiming said test model to produce a retimed test model;
   (c) abstracting said retimed test model to produce an abstracted test model; and
   (d) applying validation techniques on the abstracted test model,
   wherein while validating the design of the circuit an analysis of a functional design of the circuit is performed using test vectors generated from the abstracted test model to verify correctness of the functional design, and
   wherein in said step (b) the test model is retimed by Maximal Peripheral Retiming, which minimizes the number of internal latches.

6. The method according to claim 5 further comprising using a conventional retiming procedure for retiming of said test model wherein in said conventional retiming procedure the bus width of each input and output is taken to be zero.

7. The method according to claim 5 further comprising using a conventional retiming procedure for retiming of said test model wherein:
   a dummy node $D_1$ is added to the test model with fanout to each of the primary inputs $I_i$; and
   a dummy node $D_0$ is added with no fanin and a single fanout to $D_1$, wherein buswidths corresponding to edges are as follows:

for edge $(D_0, D_1)$, buswidth is 0,
for edge $(D_1, I_1)$, buswidth is infinite,
for outer periphery edges, buswidth is 0, and
for all other edges, buswidth is same as in original circuit.

8. A method for validating a design of a circuit comprising:
(a) generating a state-based test model of the design;
(b) retiming said test model to produce a retimed test model;
(c) abstracting said retimed test model to produce an abstracted test model; and
(d) applying validation techniques on the abstracted test model,
wherein while validating the design of the circuit an analysis of a functional design of the circuit is performed using test vectors generated from the abstracted test model to verify correctness of the functional design, and
wherein in said step (c) said retimed test model is abstracted by removing correctly positioned peripheral latches.

9. The method according to claim 8 wherein all correctly positioned output peripheral latches, and an equal number of correctly positioned input peripheral latches on all inputs are removed.

10. The method according to claim 9, further comprising using a conventional retiming procedure for retiming of said test model wherein:
a dummy node $D_1$ is added to the circuit with fanout to each of the primary inputs $I_j$; and
a dummy node $D_o$ is added with no fanin and a single fanout to $D_1$,
wherein buswidths corresponding to edges are as follows:
for edge $(D_o, D_1)$, buswidth is 0,
for edge $(D_1, I_j)$, buswidth is infinite,
for outer periphery edges, buswidth is 0, and
for all other edges, buswidth is same as in original circuit.

11. The method according to claim 8 wherein all correctly positioned output peripheral latches, and all correctly positioned input peripheral latches are removed.

12. The method according to claim 11 further comprising using a conventional retiming procedure for retiming of said test model wherein in said conventional retiming procedure the bus width of each input and output is taken to be zero.

* * * * *